US005894408A

United States Patent [19]
Stark et al.

[11] Patent Number: 5,894,408
[45] Date of Patent: Apr. 13, 1999

[54] ELECTRONIC CARTRIDGE WHICH ALLOWS DIFFERENTIAL THERMAL EXPANSION BETWEEN COMPONENTS OF THE CARTRIDGE

[75] Inventors: Michael Stark, Tempe; Michael Rutigliano, Chandler, both of Ariz.; James S. Webb, Portland, Oreg.

[73] Assignee: Intel Corporation, Santa Clara, Calif.

[21] Appl. No.: 09/024,860

[22] Filed: Feb. 17, 1998

[51] Int. Cl.[6] .................................................. H05K 7/20
[52] U.S. Cl. .......................... 361/704; 361/600; 361/707; 361/714; 361/715; 361/719; 361/720; 361/752; 361/756; 165/80.3; 165/185; 174/16.3; 312/223.1
[58] Field of Search .......................... 361/702, 704, 361/707, 709, 714–720, 728, 752, 753, 756, 758, 759, 818; 165/80.3, 185; 174/16.3, 252; 312/223.1, 223.2

[56] References Cited

U.S. PATENT DOCUMENTS 4,899,256 2/1990 Sway-Tin ........................ 361/715
5,526,229 6/1996 Wakabayashi et al. ............ 361/702

Primary Examiner—Leo P. Picard
Assistant Examiner—Boris L. Chervinsky
Attorney, Agent, or Firm—Blakely, Sokoloff, Taylor & Zafman LLP

[57] ABSTRACT

An electronic cartridge that may include a cover which is attached to a thermal element. A substrate may be located between the thermal element and the cover. The cartridge may include a first pin which extends from the thermal element through a datum hole of the substrate. The cartridge may also have a second pin which extends from the thermal element through a first float hole of the substrate. The first float hole may have a major diameter and a minor diameter. The major diameter of the first float hole may be larger than the diameter of the second pin so that the second pin can move relative to the substrate. The first float hole allows movement of the second pin when there is a differential thermal expansion between the thermal element and the substrate.

13 Claims, 2 Drawing Sheets

ELECTRONIC CARTRIDGE WHICH ALLOWS DIFFERENTIAL THERMAL EXPANSION BETWEEN COMPONENTS OF THE CARTRIDGE

BACKGROUND OF THE INVENTION

1. Field of the Invention

The present invention relates to an electronic cartridge, which contains components that can thermally expand relative to each other.

2. Background Information

Integrated circuits are typically assembled into a package that is soldered to a printed circuit board. Historically, manufacturers of integrated circuits such as microprocessors have sold integrated circuit packages to entities that mount the packages to a motherboard. The motherboard is typically incorporated into a larger system such as a personal computer.

The integrated circuit packages are typically soldered to the motherboard. The solder process requires capital equipment such as wave solder tables, etc. Additionally, the solder must be reflowed to upgrade or replace the integrated circuit package that is mounted to the board. Reflowing the solder can degrade the integrity of the motherboard and the solder joints which couple other components to the board. It would be desirable to incorporate the integrated circuit packages into a cartridge that can be plugged into a motherboard so that the customer of the integrated circuit does not have to solder the package.

It would be desirable if such a cartridge could be plugged into the circuit board by a consumer, so that the end user can upgrade a system such as a personal computer. Such a cartridge would preferably have a cover to prevent contact between the end user and the integrated circuit packages. The cover may also improve the appearance of the product.

Integrated circuits generate heat which must be removed to insure that the junction temperatures of the circuits operate below threshold levels. The heat primarily flows into the ambient through the integrated circuit packages. The packages are typically constructed from a dielectric material which has a relatively low coefficient of thermal conductivity. The low coefficient creates a relatively high thermal impedance across the package. The high thermal impedance increases the junction temperatures of the circuit.

Some packages incorporate a metal lid to reduce the thermal impedance from the integrated circuit to the ambient. A thermal element such as a heat sink may be coupled to the lid to further increase the thermal efficiency of the assembly. It would be desirable to provide a cartridge that has both a thermal element and a protective cover which are coupled to a printed circuit board which supports one or more integrated circuit packages.

Electronic assemblies are frequently exposed to environments which have varying ambient temperatures. Changes in temperature will cause the assembly to expand or contract. Different components of an electronic assembly may have different rates of thermal expansion. The different rates of thermal expansion may create stresses in the assembly. It would be desirable to provide a cartridge which allowed different components of the assembly to expand and contract relative to each other.

SUMMARY OF THE INVENTION

One embodiment of the present invention is an electronic cartridge that may include a cover which is attached to a thermal element. A substrate may be located between the thermal element and the cover. A first pin may extend from the thermal element through a datum hole of the substrate. The cartridge may also have a second pin which extends from the thermal element through a first float hole of the substrate. The first float hole may have a diameter that is larger than a diameter of the second pin.

DETAILED DESCRIPTION OF THE INVENTION

One embodiment of the present invention is an electronic cartridge that may include a cover which is attached to a thermal element. A substrate may be located between the thermal element and the cover. The cartridge may include a first pin which extends from the thermal element through a datum hole of the substrate. The cartridge may also have a second pin which extends from the thermal element through a first float hole of the substrate. The first float hole may have a major diameter and a minor diameter. The first float hole may have a diameter that is larger than the diameter of the second pin so that the second pin can move relative to the substrate. The first float hole allows movement of the second pin when there is a differential thermal expansion between the thermal element and the substrate.

The cover may have a datum boss which receives the first pin and a first float boss that receives the second pin. The first float boss may have an opening that also allows movement of the second pin to compensate for differential thermal expansion between the thermal element and the cover.

Figure 1:
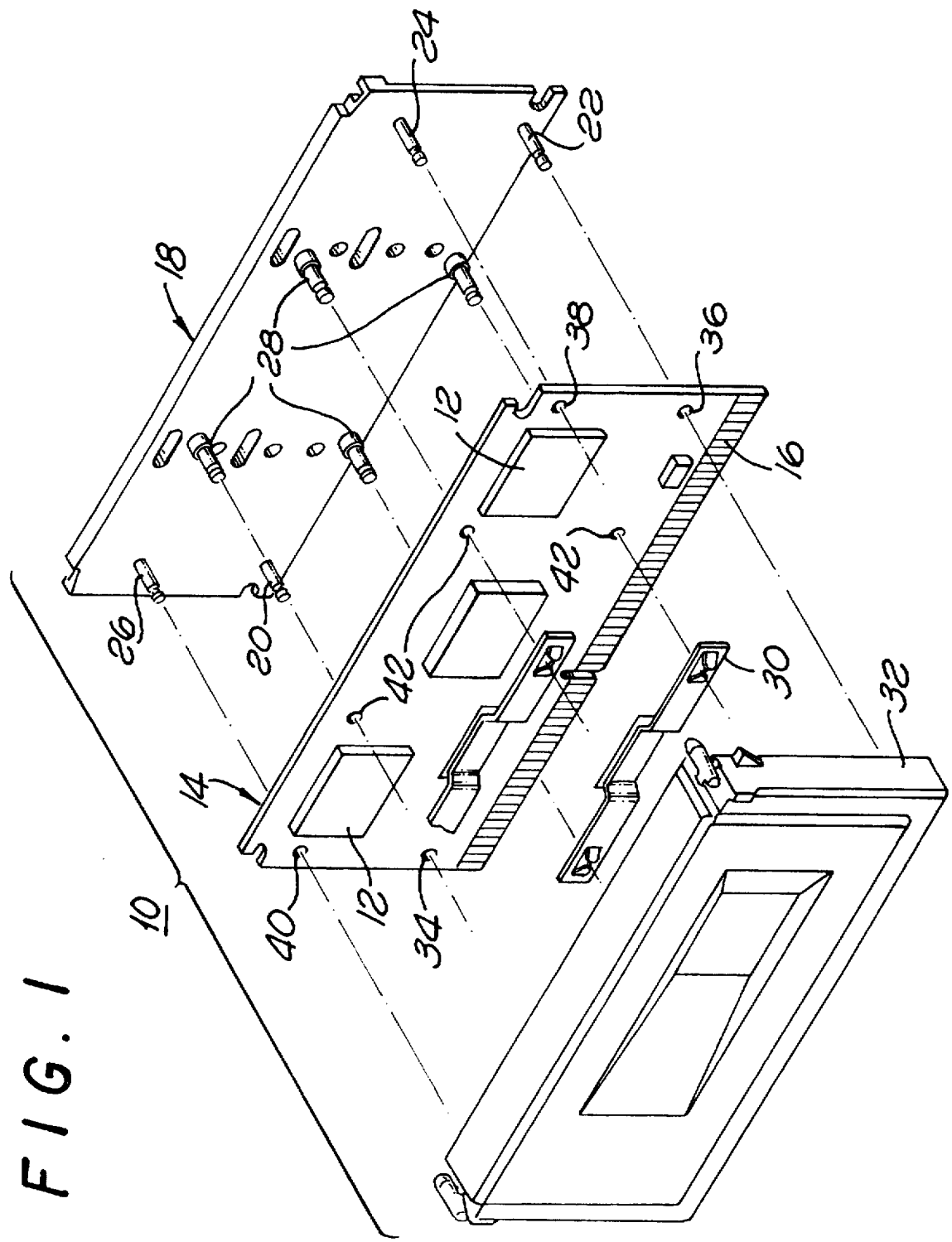
FIG. 1 is an exploded perspective view of an electronic cartridge of the present invention.

Referring to the drawings more particularly by reference numbers, FIG. 1 shows an electronic cartridge 10 of the present invention. The cartridge 10 may include one or more integrated circuit packages 12 that are mounted to a substrate 14. The packages 12 may contain integrated circuits (not shown) such as a microprocessor and memory devices. The substrate 14 is typically a printed circuit board which has surface pads, routing traces, power/ground planes and vias (not shown) as is known in the art. One edge of the substrate 14 may have a plurality of conductive pads 16. The conductive pads 16 may be inserted into a card edge connector (not shown) that is mounted to a motherboard (not shown).

The cartridge 10 may include a thermal element 18 that facilitates the removal of heat generated by the integrated circuits. The thermal element 18 may have a first pin 20, a second pin 22, a third pin 24, a fourth pin 26 and a plurality of fifth pins 28 which extend through the substrate 14. The pins 20, 22, 24 and 26 may be pressed into corresponding holes of the thermal element 18. The fifth pins 28 may be attached to a pair of spring clips 30 which couple the thermal element 18 to the substrate 14. The first 20, second 22, third 24 and fourth 26 pins may be attached to a cover 32.

The thermal element 18 may be constructed from a thermally conductive material such as aluminum or copper. The cover 32 may be constructed from a molded plastic material. The substrate 14 may be constructed from known printed circuit board materials such as fiberglass and copper. The thermal element 18, substrate 14 and cover 32 may each have a different coefficient of thermal expansion.

Consequently, each component 14, 18 and 32 may expand or contract at a different rate when the cartridge 10 is thermally cycled.

Figure 2:
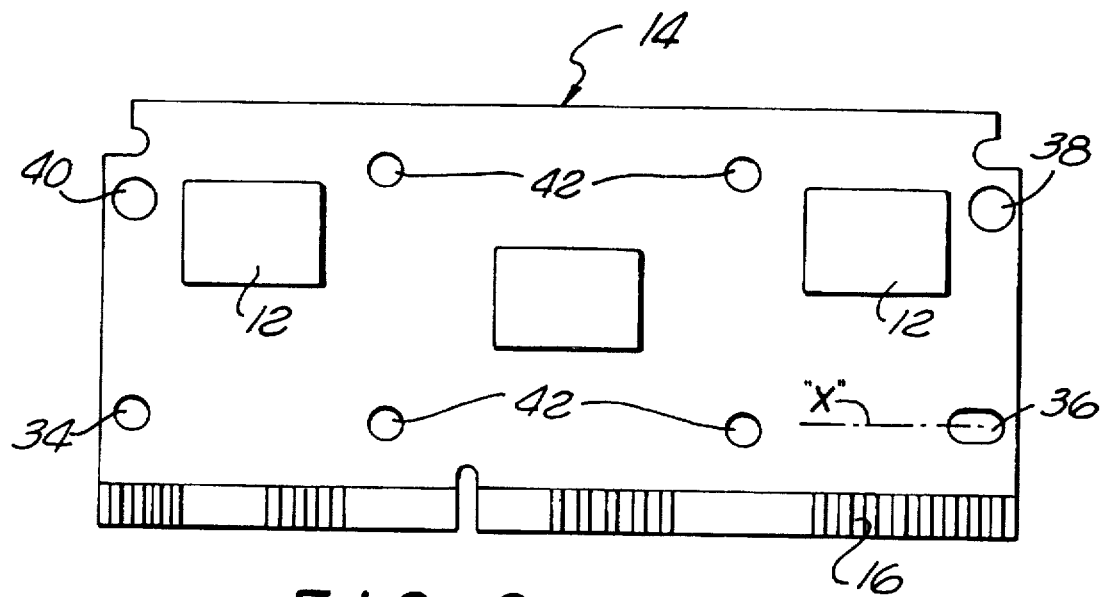
FIG. 2 is a front view of a substrate of the cartridge.

As shown in FIG. 2, the substrate 14 may have a datum hole 34, a first float hole 36, a second float hole 38 and a third float hole 40. The holes 34, 36, 38 and 40 allow the pins 20, 22, 24 and 26 to extend through the substrate 14. The substrate 14 may also have a plurality of clearance holes 42 that allow the fifth pins 28 to be inserted through the holes 42 and attached to the spring clips 30.

The datum hole 34 may have a diameter that is essentially equal to the diameter of the first pin 20 to prevent relative movement between the substrate 14 and the pin 20. The first pin 20 and datum 34 may provide a means to align the thermal element 18 with the substrate 14.

The first float hole 36 may have a minor diameter that is essentially equal to the diameter of the second pin 22 and a major diameter that is greater than the diameter of the pin 22. The first float hole 36 allows the second pin 22 to move along an x axis of the substrate 14. The first float hole 36 provides x axis "float". The second 38 and third 40 float holes may have a diameter that is larger than the diameters of the third 24 and fourth 26 pins, respectively. The oversized float holes 38 and 40 allow the pins 24 and 26 to move relative to the substrate 14.

When the cartridge is thermally cycled the thermal element 18 may expand at a greater rate than the substrate 14. The float holes 36, 38 and 40 allow the pins 22, 24 and 26 to move and thus compensates for differential expansion without inducing stresses in the cartridge 10.

Figure 3:
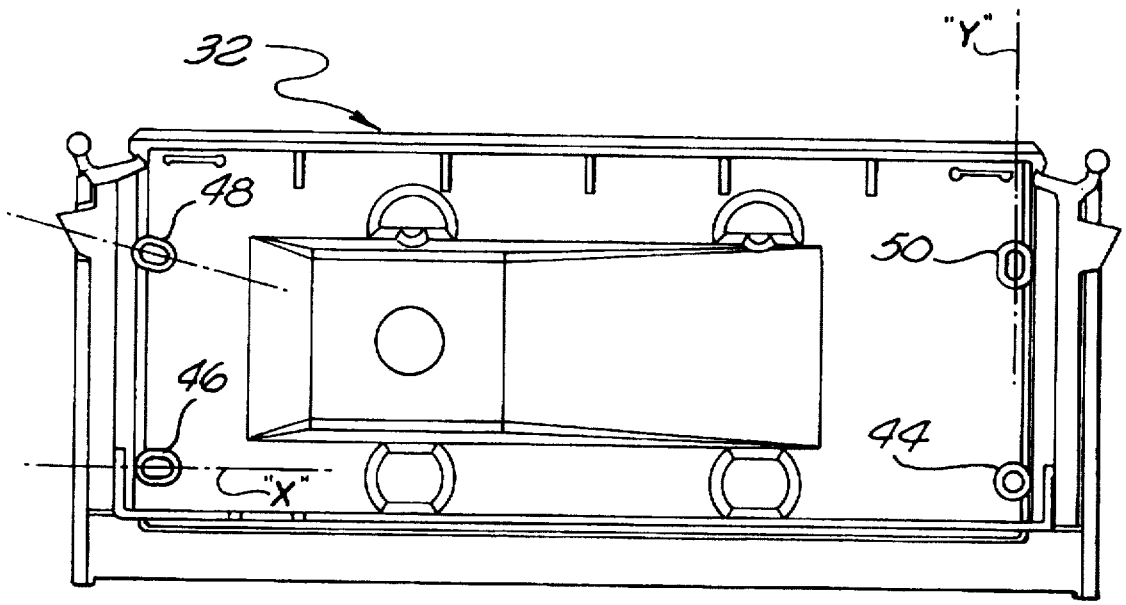
FIG. 3 is a rear view of a cover of the cartridge.

As shown in FIG. 3, the cover 32 may have a datum boss 44 that receives the first pin 20, a first float boss 46 that receives the second pin 22, a second float boss 48 that receives the third pin 24 and third float boss 50 that receives the fourth pin 26. The datum boss 44 may have an opening with a diameter that is essentially equal to the diameter of the first pin 20. The first pin 20, datum hole 34 and datum boss 44 may align the cover 32 to the substrate 14. The first 46, second 48 and third 50 bosses may have openings which have a minor diameter that is essentially equal to the diameter of each pin 22, 24 and 26, respectively, and a major diameter that is larger than the diameter of each pin 22, 24 and 26.

The first float boss 46 allows the second pin 22 to move or "float" along the x axis of the cover 32. The third float boss 50 allows the fourth pin 26 to move along the y axis of the cover 32. The second float boss 48 allows the third pin 24 to move along a diagonal axis of the cover 32. It being found that the corner opposite from the fixed datum boss 44 expands essentially along the diagonal axis of the cover 32. The float bosses 46, 48 and 50 allow relative thermal expansion between the thermal element 18 and the cover 32.

The cartridge 10 can be assembled by merely inserting the pins 20, 22, 24 and 26 through the substrate holes 34, 36, 38 and 40 and into the bosses 44, 46, 48 and 50.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:

a thermal element;

a cover;

a substrate that is located between said thermal element and said cover, said substrate has a datum hole, and a first hole;

a first pin that extends from said thermal element through said datum hole and is attached to said cover;

a second pin that extends from said thermal element through said first float hole and is attached to said cover, said second pin being smaller than said first float hole so that said thermal element can move relative to said substrate.

2. The cartridge as recited in claim 1, wherein said datum hole has a diameter that is essentially equal to a diameter of said first pin.

3. The cartridge as recited in claim 1, wherein said first float hole has a major diameter that is greater than said diameter of said second pin.

4. The cartridge as recited in claim 1, wherein said thermal element includes a third pin and a fourth pin that extend through a second float hole and a third float hole of said substrate, respectively.

5. The cartridge as recited in claim 1, wherein said cover has a datum boss that receives said first pin.

6. The cartridge as recited in claim 5, wherein said datum boss includes an opening which has a diameter that is essentially equal to a diameter of said first pin.

7. The cartridge as recited in claim 5, wherein said cover has a first float boss that receives said second pin, said second float boss has an opening with a diameter that is larger than said second pin.

8. The cartridge as recited in claim 7, wherein said first float boss opening has a diameter that is greater than said diameter of said second pin.

9. An electronic cartridge, comprising:

a substrate;

a thermal element;

a first pin that extends from said thermal element and through said substrate;

a second pin that extends from said thermal element and through said substrate, said second pin has a diameter;

a cover which has a datum boss that receives said first pin and a first float boss that receives said second pin, said first float boss includes an opening which has a diameter that is greater than said diameter of said second pin.

10. The cartridge as recited in claim 9, wherein said datum boss includes an opening which has a diameter that is essentially equal to a diameter of said first pin.

11. The cartridge as recited in claim 9, wherein said first float boss has a diameter that is greater than said diameter of said second pin.

12. The cartridge as recited in claim 9, wherein said cover has a second float boss that receives a third pin of said thermal element, said second float boss includes an opening which has a major diameter and a minor diameter, said major diameter being greater than a diameter of said third pin, and extends along a diagonal axis of said cover.

13. The cartridge as recited in claim 9, wherein said cover has a third float boss that receives a fourth pin of said thermal element, said third float boss includes an opening which has a major diameter and a minor diameter, said major diameter being greater than a diameter of said fourth pin.

* * * * *

UNITED STATES PATENT AND TRADEMARK OFFICE
Certificate

Patent No. 5,894,408                                                              Patented: April 13, 1999

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Michael Stark, Tempe, Arizona; Michael Rutigliano, Chandler, Arizona; James S. Webb, Portland, Oregon; and James R. Yurchenco, Palo Alto, California.

Signed and Sealed this Sixteenth Day of April 2002.

DARREN SCHUBERG
*Supervisory Patent Examiner*
Art Unit 2835

UNITED STATES PATENT AND TRADEMARK OFFICE
CERTIFICATE OF CORRECTION

PATENT NO. : 5,894,408 Page 1 of 1
DATED : April 13, 1999
INVENTOR(S) : Stark et al.

It is certified that error appears in the above-identified patent and that said Letters Patent is hereby corrected as shown below:

Column 4,
Line 4, after "first" insert -- float --.

Signed and Sealed this

Second Day of December, 2003

JAMES E. ROGAN
*Director of the United States Patent and Trademark Office*